US009479717B2

(12) United States Patent
Hynecek

(10) Patent No.: US 9,479,717 B2
(45) Date of Patent: Oct. 25, 2016

(54) IMAGE SENSOR ARRAY WITH EXTERNAL CHARGE DETECTION CIRCUITRY

(71) Applicant: Semiconductor Components Industries, LLC, Phoenix, AZ (US)

(72) Inventor: Jaroslav Hynecek, Allen, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 264 days.

(21) Appl. No.: 14/183,042

(22) Filed: Feb. 18, 2014

(65) Prior Publication Data

US 2015/0237276 A1    Aug. 20, 2015

(51) Int. Cl.
| H04N 5/363 | (2011.01) |
| H04N 5/374 | (2011.01) |
| H04N 5/3745 | (2011.01) |
| H04N 5/378 | (2011.01) |
| H04N 9/04 | (2006.01) |
| H01L 31/105 | (2006.01) |
| H01L 27/146 | (2006.01) |

(52) U.S. Cl.
CPC .......... *H04N 5/363* (2013.01); *H01L 27/1461* (2013.01); *H01L 27/14607* (2013.01); *H01L 27/14612* (2013.01); *H01L 27/14623* (2013.01); *H01L 27/14641* (2013.01); *H01L 27/14654* (2013.01); *H01L 31/105* (2013.01); *H04N 5/374* (2013.01); *H04N 5/378* (2013.01); *H04N 5/37455* (2013.01); *H04N 5/37457* (2013.01); *H04N 9/045* (2013.01)

(58) Field of Classification Search
CPC .............................. H01L 27/146; H04N 5/335
See application file for complete search history.

(56) References Cited

U.S. PATENT DOCUMENTS

| 6,661,500 B1 * | 12/2003 | Kindt | G01S 7/4863 356/141.1 |
| 8,507,840 B2 | 8/2013 | Yu et al. | |
| 2006/0027730 A1 * | 2/2006 | Bamji | G01S 7/487 250/208.1 |
| 2006/0131484 A1 | 6/2006 | Peting | |
| 2009/0256060 A1 * | 10/2009 | Meynants | H04N 5/353 250/208.1 |
| 2010/0187401 A1 * | 7/2010 | Kawahito | H01L 27/14609 250/208.1 |
| 2011/0025655 A1 * | 2/2011 | Nishimura | G09G 3/3688 345/204 |
| 2011/0128428 A1 * | 6/2011 | Takatoku | G06F 3/0412 348/307 |
| 2011/0187906 A1 | 8/2011 | Chaji et al. | |
| 2012/0132789 A1 * | 5/2012 | Ricard | H04N 5/3745 250/214 A |
| 2012/0307030 A1 * | 12/2012 | Blanquart | H01L 27/14601 348/76 |
| 2013/0009321 A1 * | 1/2013 | Kagawa | H01L 23/481 257/774 |
| 2013/0038760 A1 | 2/2013 | Blanquart et al. | |
| 2013/0113061 A1 * | 5/2013 | Lai | H01L 27/1463 257/432 |

* cited by examiner

*Primary Examiner* — Mekonnen Dagnew
(74) *Attorney, Agent, or Firm* — Treyz Law Group, P.C.; Kendall P. Woodruff

(57) ABSTRACT

An image sensor may include an array of pixels that do not include any source follower, reset, or addressing transistors, which helps to increase pixel well capacity, reduces or eliminates random telegraph signal (RTS) noise, and reduces undesirable dark current. Charge to voltage conversion may be performed by charge detection circuitry that is external to the array of pixels. The charge detection circuitry may include amplifier circuitry such as an operational amplifier and may be located at the periphery of the array of pixels or on a different semiconductor substrate. By locating the charge detection circuitry outside of the array of pixels, additional flexibility may be provided for the charge detection circuitry. The charge detection circuitry may be provided with switchable gain or with non-linear charge to voltage conversion capability.

20 Claims, 7 Drawing Sheets

IMAGE SENSOR ARRAY WITH EXTERNAL CHARGE DETECTION CIRCUITRY

BACKGROUND

Image sensors typically sense light by converting impinging photons into electrons or holes that are integrated (e.g., collected) in sensor pixels. After completion of an integration cycle, collected charge is converted into a voltage which is supplied to the output terminals of the sensor, in complementary metal-oxide-semiconductor (CMOS) image sensors the charge to voltage conversion is accomplished directly in the pixels themselves and the analog pixel, voltage is transferred to the output terminals through various pixel addressing and scanning schemes. The analog signal can also be converted on-chip to a digital equivalent before reaching the chip output. The pixels have incorporated in them a buffer amplifier, typically a Source Follower (SP), which drives the sense lines that are connected to the pixels by suitable addressing transistors. After charge to voltage conversion is completed and the resulting signal transferred out from the pixels, the pixels are reset in order to prepare for accumulation of new charge. In pixels that are using the Floating Diffusion (FD) as the charge detection node, the reset is accomplished by turning on a reset transistor, also incorporated in each pixel, that conductively connects the FD node to a voltage reference, which is typically the pixel drain node. This reset step removes collected charge; however, thermal noise such as kTC-reset noise may be generated. Such noise may be removed from the signal using the Correlated Double Sampling (CDS) signal processing technique in order to achieve desired low noise performance. The typical CMOS image sensors that utilize the CDS concept usually require three (3T) or four transistors (4T) in the pixel one of which serves as the charge transferring (Tx) transistor. It is possible to share some of the pixel circuit transistors among several photodiodes, which may reduce the pixel size.

DETAILED DESCRIPTION

Figure 1:
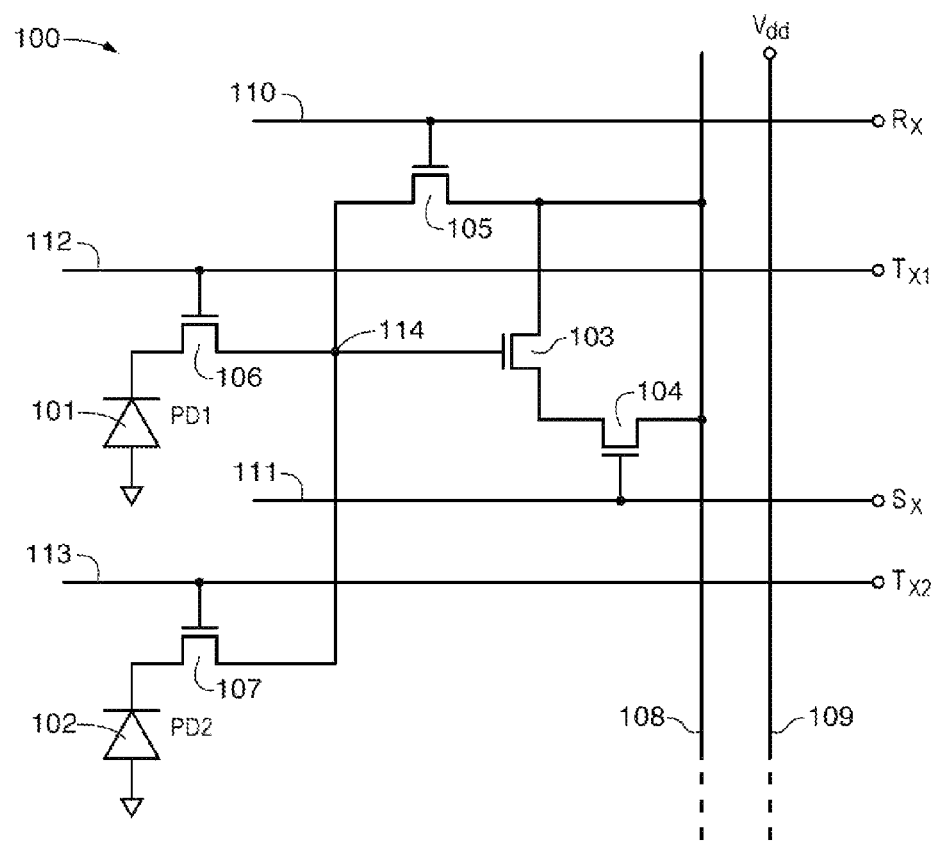
FIG. 1 is a simplified circuit diagram of conventional image sensor pixels consisting of two photodiodes sharing circuitry which includes two transfer gates, a source follower transistor, an addressing transistor, and a reset transistor.

A simplified circuit diagram 100 of a typical two-way circuit sharing arrangement is shown in FIG. 1. Photodiodes 101 and 102 share the same FD charge detection node 114 to which the source follower transistor (SF) 103 gate is also connected. The SF drain of transistor 103 is connected to the Vdd column bias line 109 and the source of transistor 103 is coupled to a column signal line 108 through an addressing transistor 104. Charge detection node 114 is reset by transistor 105 that is coupled to Vdd column bias line 109. Charge from the photodiodes is transferred onto FD node 114 by charge transfer transistors 106 and 107. The reset transistor gate is controlled by the row line 110, the charge transfer transistor gates by the row lines 112 and 113, and the addressing transistor gate is controlled by the row addressing line 111. In the typical two-way sharing arrangement, each pair of pixel photodiodes in a pixel array contains a total of 5 transistors. This consumes significant valuable pixel area considering also the necessary isolation spaces that need to be inserted between these devices. It is known in the art that the device sharing can be extended up to 8 photodiodes (i.e., an eight-way pixel sharing arrangement), which provides improvement, but each group of pixels still, requires the SF transistor, the reset transistor, the addressing transistor, and the charge transfer transistors.

These limitations in the prior art are minimized in the present invention by providing the image sensor array with pixels that do not have any source-follower transistors, reset transistors, or addressing transistors within the array. This helps to conserve valuable pixel area, which can then, if desired, be used for additional functionality such as charge storage. The increased photo diode charge storage capacity helps to increase the pixel dynamic range (DR), which is a desirable feature and an advantage. The circuit sharing arrangement described herein may sometimes be referred to as pixel, super sharing technology (PSST), and all the pixels of a given pixel column or of a significant portion of a column may share the same charge detection amplifier and reset transistor. The charge detection amplifiers may be located at the edges of the array or in a separate carrier chip in case that the chip stacking technology is used. Such amplifiers can be built with improved performance and voltage gain, and low noise, because they may not be restricted by the available pixel area within the pixel array. The column amplifiers may also help to eliminate random telegraph (RTS) noise, which is a significant problem particularly for small geometry transistors (e.g., 110 nm, 95 nm, 45 nm, etc.). This may be advantageous for image sensor arrays that have small size pixels.

Figure 2:
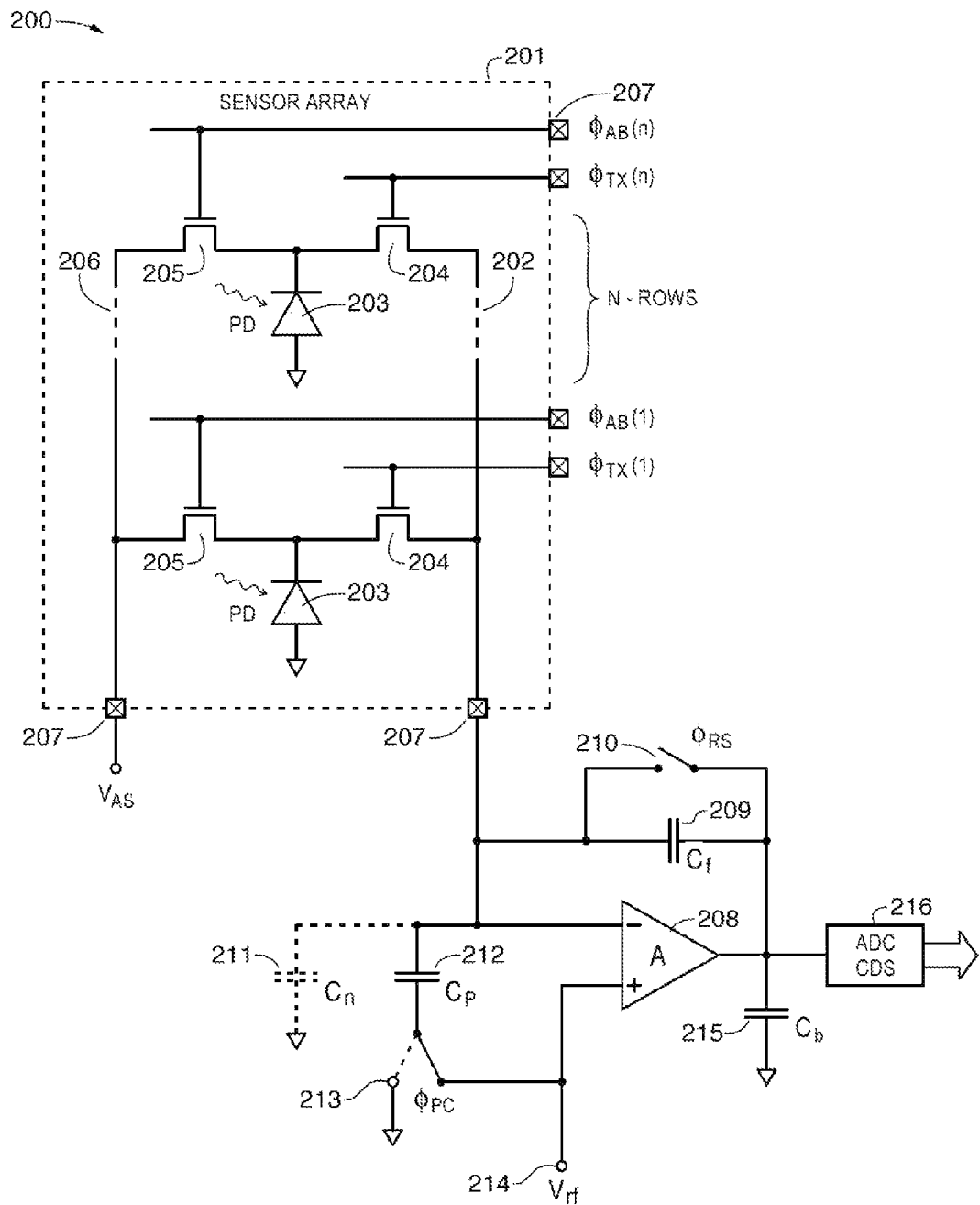
FIG. 2 is a diagram of an imager having an array of pixels with external charge detection circuitry in accordance with an embodiment of the invention.

A simplified circuit diagram of sensor circuitry 200 including a pixel array 201 with shared readout circuitry is shown in FIG. 2. Pixel array 201 may be a semiconductor chip that includes n rows of pixels. The pixels may consist of photodiodes 203 that are connected via charge transferring transistors 204 to common floating diffusion (FD) nodes connected together by common bus line 202. If desired, four adjacent photodiodes may be coupled to the same FD node and the FD connections may be alternated between two or more bus lines to help reduce the FD node capacitance Cn

211. FD node capacitance Cn is indicated in the drawing by a dashed line. The pixels may include a charge clearing transistor 205 that, if desired, may also serve as a blooming control by allowing pixel overflow charge to be drained into a charge drain 206 that is also bussed by a column or row drain bus line. Blooming control may be performed by biasing the gate of one or more transistors 205 to a suitable voltage bias VAB. The sensor array may be connected to a carrier chip or to the rest of the imager circuitry by connection nodes 207. In a stacked chip package, connection nodes 207 may be vias such as through-silicon vias formed through a chip substrate.

FD bus line 202 may be connected to the negative input of operational amplifier 208 that has a feedback capacitor Cf 209 coupled in a feedback loop between the output of amplifier 208 and the negative input. The amplifier may be reset using switch 210 and its frequency response may be limited by capacitor Cb 215, which reduces noise by limiting bandwidth of the amplifier. If desired, the FD node 202 may be pre-charged prior to charge transfer from the PD in order to obtain a higher voltage margin swing at the amplifier output to accommodate the voltage swing caused by the transferred charge from photodiodes. The amount of the FD node pre-charge may be controlled by the value of the capacitor Cp 212 and the pre-charge may be initiated by changing the position of switch 213 from the ground connection to reference voltage node connection 214. The amplifier positive input may be coupled to voltage reference node 214. The output from the amplifier may be supplied to correlated double sampling (CDS) and analog-to-digital converter (ADC) circuitry 216. One or more amplifiers may be provided for each pixel column depending on the number of column FD node bus lines (e.g., for each column bus line). The array may be scanned in a row by row fashion when transfer signals $\phi_{TX}$ of corresponding row transfer gates are pulsed 204 (e.g., $\phi_{TX1}$ for row 1, $\phi_{TXn}$ for row n). The row-by-row scanning may sometimes be referred to as a Rolling Shutter (RS) mode of operation, if desired, when the scan of a particular sub-group of the super shared FDs in a larger image sensor array is completed, the corresponding amplifiers may be turned off (e.g., powered off) and the amplifiers for the next subgroup may be turned on, thereby saving power. The digital outputs from the CDS and ADC circuitry may be scanned in a horizontal (across the columns) direction to form a horizontal line signal (e.g., provided to imaging processing circuitry such as a digital signal processor).

Because the amplifier is now located at the periphery of the array or in the carrier chip instead of in each pixel it may be possible to use a more sophisticated type (e.g., because more flexibility in circuit area may be available outside of the pixel array than within the pixel array). For example, use of the voltage controlled feedback capacitor Cf 209 in the feedback loop to provide nonlinear charge to voltage conversion and thereby compressing the signal dynamic range may be made possible. As another example, the gain of the column amplifiers may be adjusted by changing the value of the feedback capacitor Cf 209. This may be accomplished by using switches to switch in or out additional capacitors that thus become connected in parallel to capacitor Cf (e.g., selectively adding or removing capacitance).

Figure 3:
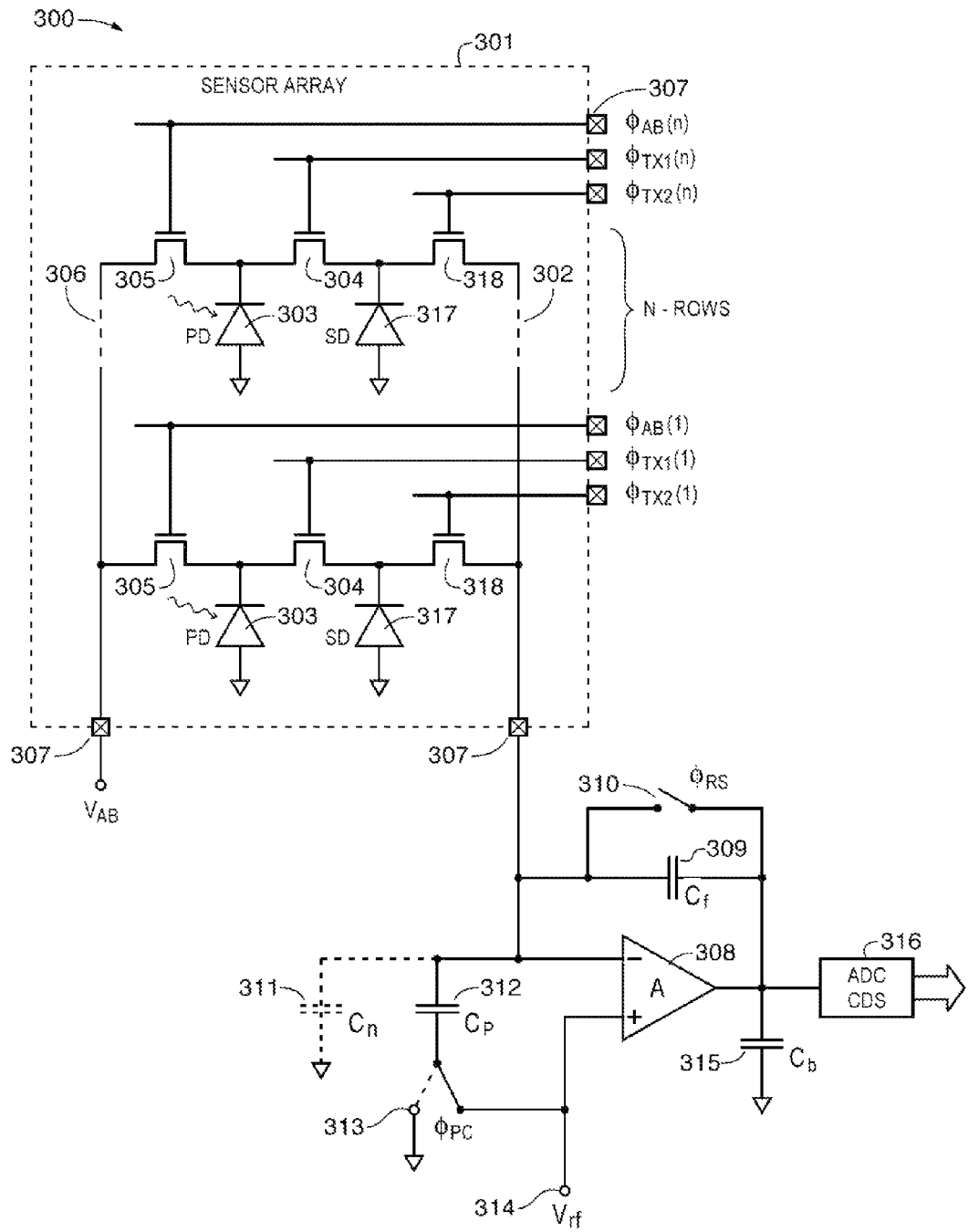
FIG. 3 is a circuit diagram of an array of pixels with external charge detection circuitry in a global shutter mode configuration in accordance with an embodiment of the invention.

FIG. 3 is a diagram showing how pixel array-external readout circuitry may be used in a Global Shutter (GS) image sensing array. As shown in FIG. 3, image sensor circuitry 300 includes image sensor array 301 having photodiodes 303 and additional charge storage diodes 317 with corresponding charge transfer transistors 318. Photodiodes 303 may collect photo-generated charge, which may be transferred by turning on charge transfer transistor 304 to storage diodes 317 globally (e.g., the charge from all photodiodes may be transferred to storage diodes 317 simultaneously by asserting signals $\phi_{TX1 \ldots n}$). Storage diodes 317 may be shielded from the impinging light, so the signal in them can be scanned sequentially without light, interference (e.g., from ambient, light or an image scene to be captured). Pixel charge clearing, anti-blooming transistors 305, and drain bus 306 may operate similarly as in FIG. 2. The connections to the rest of the sensor circuitry located on the same chip or in a carrier chip may be formed using via 307 and FD node busses 302 (e.g., one bus per column of pixels).

The charge detection steps may be similar to FIG. 2 using external readout circuitry including operational amplifier 308, negative feedback capacitor Cf 309, and reset switch 310. Pre-charge of the FD node capacitance Cn 311 may be performed using capacitor Cp 312 and switch 313 that selectively connects capacitor 312 either to ground or to a voltage reference Vrf 314. The signal output from amplifier 308 may be filtered by filtering capacitor 315 Cb before provided to CDS and ADC signal processing circuitry 316.

Figure 4:
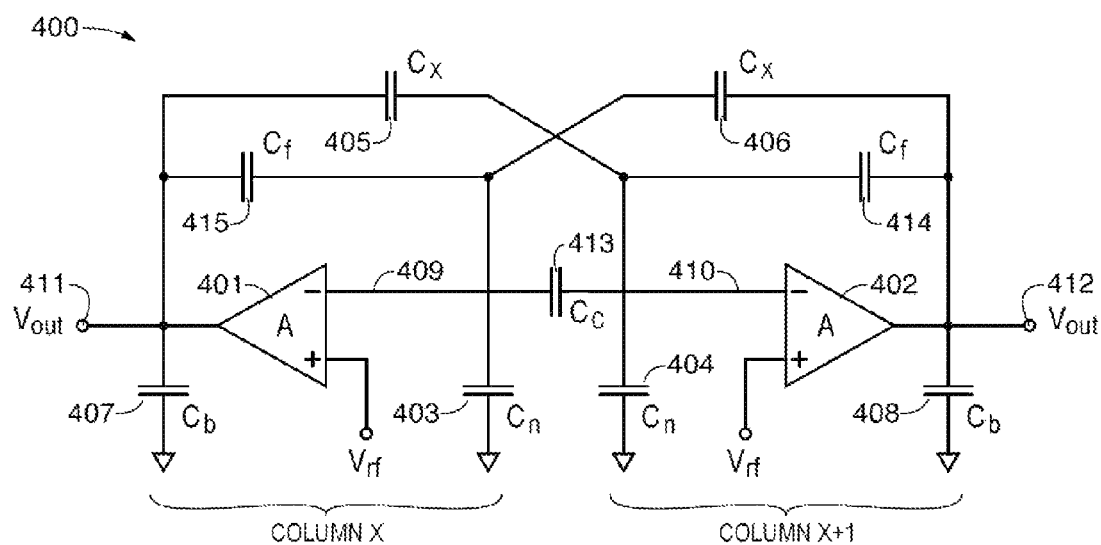
FIG. 4 is a circuit diagram of compensation circuitry that may be placed between column paths of an array of pixels and uses charge detection circuitry external to the array of pixels in compensating for parasitic capacitance between the column paths in accordance with an embodiment of the invention.

In the scenarios of FIGS. 2 and 3 in which source follower buffers are removed from the pixel array, it may be possible that parasitic coupling between relatively long column FD lines could result in substantial electrical cross talk. Such cross talk can be compensated for using compensation circuitry 400 as shown in FIG. 4. Circuitry 400 uses existing column amplifiers 401 and 402 with feedback capacitors Cf 414 and 415 (e.g., column amplifier 308 of FIG. 3 from a given pixel column and an additional column amplifier from an adjacent pixel column) in addition to compensating feedback capacitors Cx 405 and 406. For example, capacitor Cx 405 may be coupled between the output 411 of amplifier 401 of a first pixel column X and the input node 410 of amplifier 402 of a neighboring, second pixel column X+1. Paths 403 and 404 may have an approximate effective capacitance Cn 404. Similarly, output 412 of amplifier 402 may be coupled through capacitor Cx 406 to input node 409 of amplifier 401 that has the equivalent node capacitance Cn 403. Frequency bandwidth limiting capacitors Cb 407 and 408 may operate similarly to FIG. 2.

In the example of FIG. 4, compensation circuitry 400 between column X and only one neighboring column X+1 is shown for simplicity and is merely illustrative. In general, each column line may include two neighbors (e.g., X+1 to the right and X−1 to the left) for which compensation may be implemented. The capacitance of compensating capacitor Cx may be selected based on the coupling capacitance Cc between the adjacent column lines. For example, the capacitance of capacitor Cx may be selected according to the formula Cx=Cc/A, where A is the gain of amplifiers 401 and 402.

Figure 5:
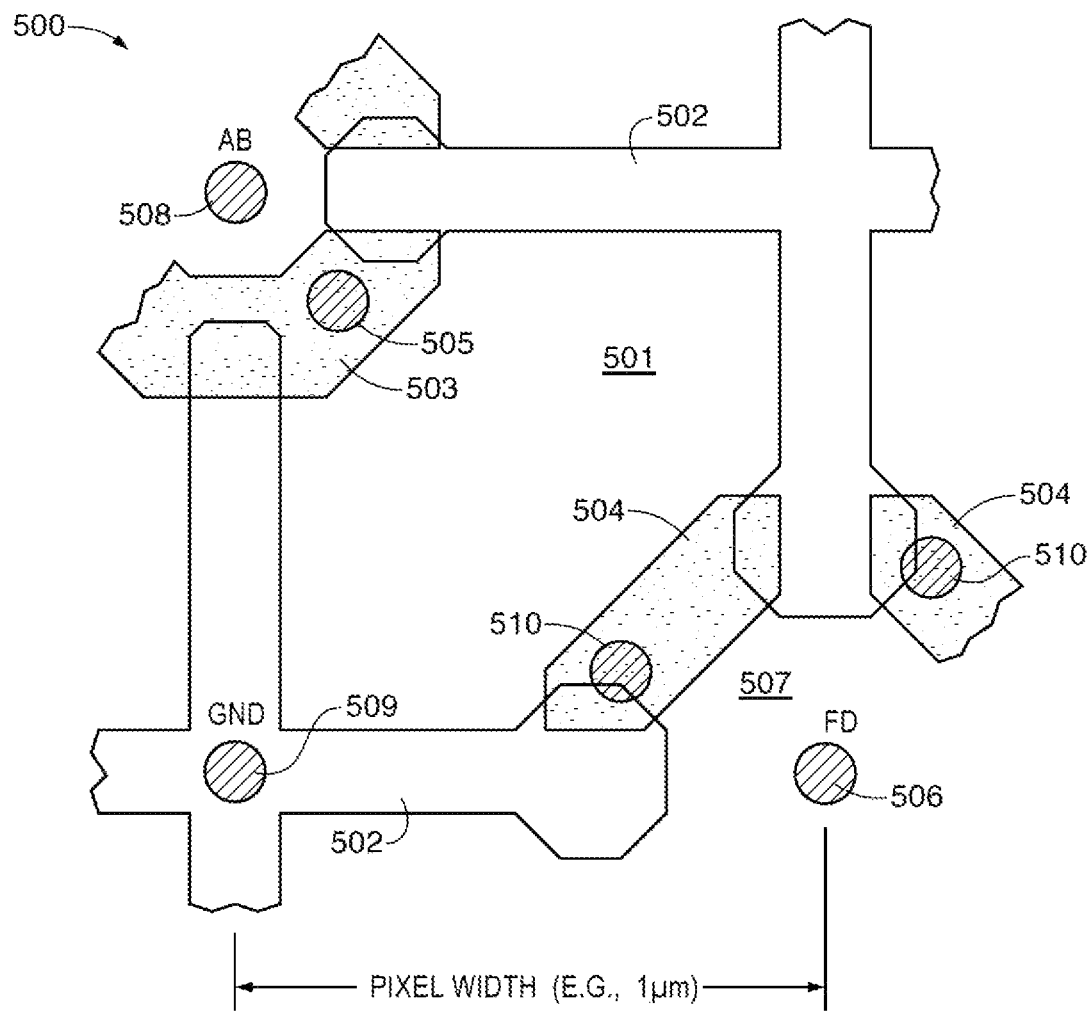
FIG. 5 is a diagram of an illustrative layout of a pixel array that may be coupled to external charge detection circuitry in accordance with an embodiment of the invention.

FIG. 5 is an illustrative layout topology 500 (e.g., a top view) of a pixel in a pixel array in which readout circuitry has been removed (e.g., formed as external circuitry). As shown in FIG. 5, charge storage photodiode area 501 is bounded by channel stop regions 502, charge transfer gate region 504, and reset (e.g., anti-blooming) gate region 503. Floating diffusion region FD is an N+ contact under via 506, which is located a certain distance away from the transfer gate edge (e.g., the edge of region 504) thus forming the charge drift region 507, which may be depleted of all mobile charge. This may substantially lower the overall FD node capacitance. FD region 507 may be bounded by four neighboring pixel transfer gates (e.g., only upper left and upper right shown in FIG. 5, but may include lower left and lower right transfer gates), which also helps to reduce the FD node capacitance by using only one FD region for 4 pixels. It may be desirable to use a 4-shared configuration (e.g., 4-way sharing between pixels) for the reset drain where the four neighboring photodiodes share reset gates and supply charge to a single AB diffusion region formed by an N+ diffusion located under via 508. Metal layers have been for simplicity omitted from the drawing and only metal vias 505, 506, 508, 509, and 510 are shown. The ground connection to the pixel may be the P+ contact formed under via 509. The pixel layout thus has an increased charge storage area relative to arrangements in which readout circuitry is formed in the pixel array, which is an advantage resulting in high charge storage capacity and thus in a large pixel dynamic range (DR). Eliminating the source-follower transistor from the pixel also automatically eliminates RTS noise from this image sensor array, which is an additional advantage.

Figure 6:
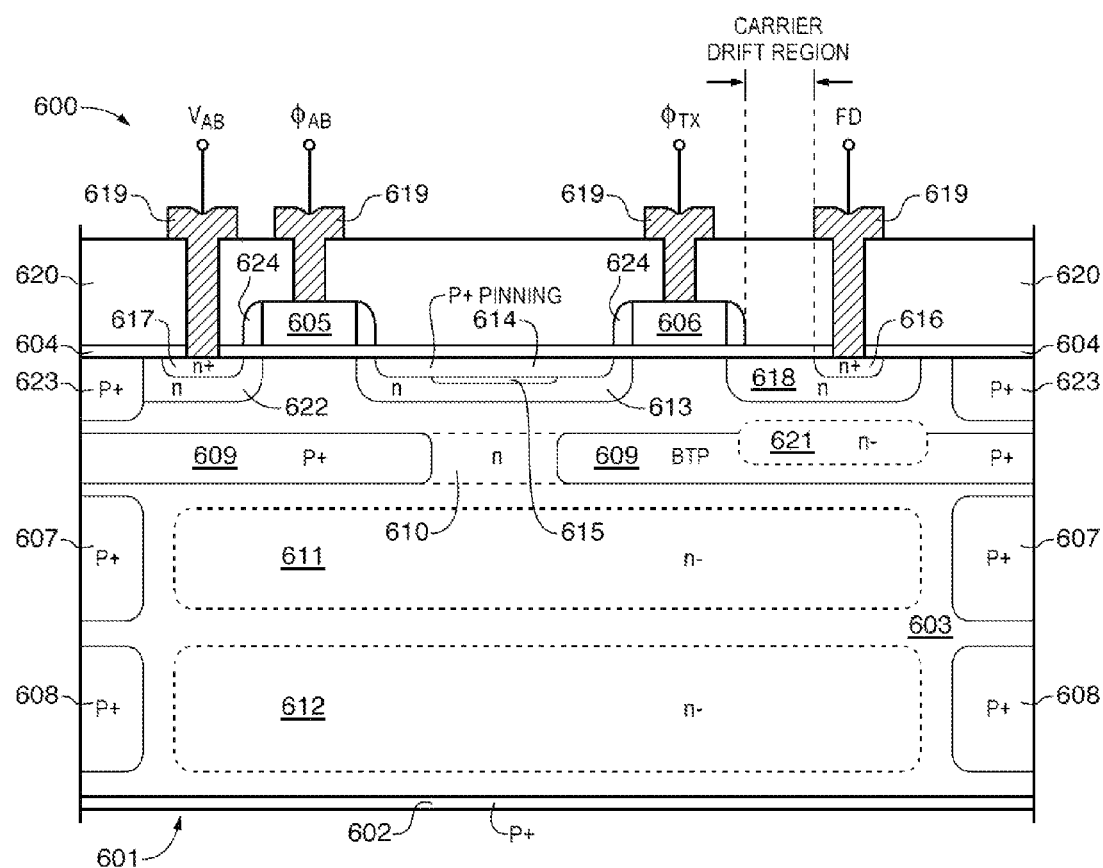
FIG. 6 is an illustrative cross-sectional diagram of a pixel that may be coupled to external charge detection circuitry in accordance with an embodiment of the invention.

FIG. 6 is an illustrative cross section of a pixel 600 in an array having external pixel readout circuitry. Semiconductor substrate 601 (e.g., silicon) may be covered by an epitaxial layer 603 (e.g., deposited on the substrate). The back surface of the substrate may have p+ type doped layer 602 incorporated in it, which may help to reduce generated dark current. In the example of FIG. 6, the pixel array is illuminated from the back through layers 602 and 603 (e.g., back-side illumination). This example is merely illustrative. If desired, a sensor array may be illuminated from the front (e.g., in a front-side illumination arrangement). Other methods of dark current reduction can also be used. For example, hafnium oxide having negative charge may be deposited on the substrate bulk thus causing accumulation of holes at the Silicon-Silicon oxide interface (e.g., instead of depositing the doping layer 602). Oxide layer 604 may be deposited on the top of the epitaxial layer serving to isolate the poly-silicon n+ type doped transfer gate 606 and the anti-blooming-reset gate 605 from the substrate. Another inter-level (IL) oxide layer 620 may be deposited on top of layer 604 and on top of (e.g., covering) poly-silicon gates 606 and 605. Layer 620 may consist of multiple IL layers deposited during the formation of several levels of metal interconnections (as an example). This is not shown in the drawing, only the metal via 619 that may connect the pixel active regions to the corresponding metal wiring are shown for simplicity.

Pixel 600 may include p+ type doped isolation regions 608, 607, and 623 that define the borders between individual pixels. The p+ type doped isolation layer (BTP) 609 may help to increase the charge storage well capacity. Isolation layer 609 includes opening 610 that may be formed by a compensating n+ type doped implant. The opening may enable charge generated in n− type doped regions 612 and 611 to flow into n-type doped charge storage region 613. Another p-type doped region 615 may be implanted through the same mask opening as the n+ type doped implant that formed the opening 610. P-type region 615 serves to form a flat potential profile in the pixel thus allowing a smooth charge transfer from the PD to the FD (e.g., to a signal bus such as bus 202 of FIG. 2) while helping to minimize residual charge in the pixel that would cause image lag. The PD structure may be completed by forming p+ type doped pinning implant 614. This implant may be placed into the structure after the formation of spacers 624, which provide the proper edge alignment of the charge storage implant 613 with the pinning implant 614.

Pixel 600 may include charge drift region 618 that spans the distance between the edge of the transfer gate 606 and the FD n+ type doped region 616. This region is n-type doped and may be fully depleted of mobile charge, which helps to reduce the FD node capacitance. If desired, another n-type doped region 621 may be implanted under drift region 618, which is also depleted of all mobile charge and helps to reduce the FD node capacitance. The anti-blooming drain may be formed from n+ type doped region 617 and n-type doped region 622.

The example of FIG. 6 in which a pixel is provided with a p-type doped epitaxial layer, p+ type doped pixel separation regions, p+ type doped pinning layers, and n+ type doped junctions is merely illustrative. If desired, the polarities of doped regions may be reversed while using an n-type doped epitaxial layer, n+ type doped pixel separation regions, n+ type doped pinning layers, and p-f type doped junction, which remains in the spirit and the scope of the present invention. If desired, the pixels of the array may be provided with color sensing capabilities by depositing various color filters and micro lenses on top of the pixels or on the back side when the pixels are illuminated from the back side.

Figure 7:
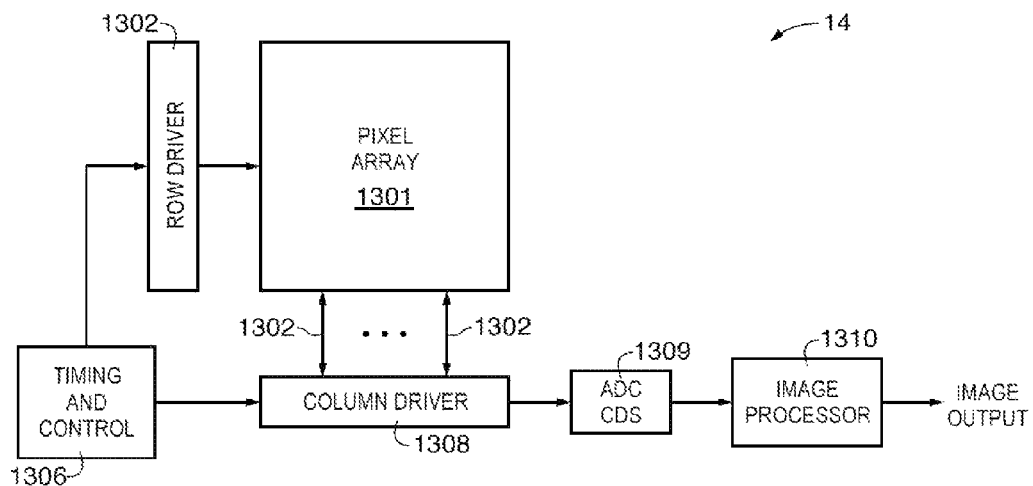
FIG. 7 is a block diagram of an imager employing a pixel array with external charge detection circuitry in accordance with an embodiment of the present invention.

FIG. 7 illustrates a simplified block diagram of an image sensor 14, for example a CMOS, image sensor, employing a pixel array 1301 having external charge detection circuitry. Pixel array 1301 includes a plurality of pixels arranged in a predetermined number of columns and rows. The row lines are selectively activated by the row driver 1302 as controlled by timing and control circuit 1306. For example, control circuit 1306 may control row drive 1302 to drive appropriate signals such as anti-blooming control signal $\phi_{AB}$ and transfer gate control signal $\phi_{TX}$ of FIG. 1 for each of the rows in the array. In a correlated double sampling arrangement, pixel signals sampled using charge detection circuitry 1308 and correlated double sampling (CDS) circuitry 1309 include a pixel reset signal Vrst and a pixel image signal Vsig for each pixel (or each photosensitive region of each pixel). A differential signal Vrst-Vsig may be produced for each pixel (or each photosensitive area of each pixel), which is amplified and digitized by analog-to-digital converter (ADC) and double sampling circuitry 1309. The analog to digital converter converts the analog pixel signals to digital signals, which are fed to an image processor 1310 which forms a digital image.

Figure 8:
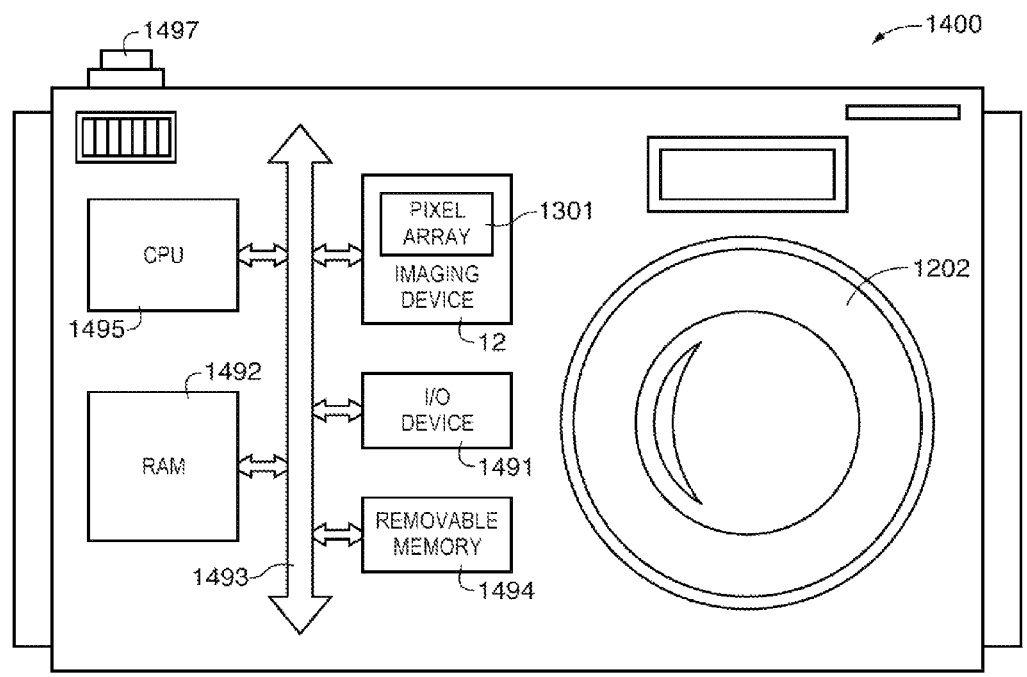
FIG. 8 is a block diagram of a processor system, employing the imager of FIG. 6 in accordance with an embodiment of the present invention.

FIG. 8 is a simplified diagram of an illustrative processor system 1400, such as a digital camera, which includes an imaging device 12 (e.g., a camera module) employing an imager having a pixel array with separate charge detection circuitry is described above. The processor system 1400 is exemplary of a system having digital circuits that could include imaging device 12. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 1400, for example a digital still or video camera system, generally includes a lens 202 for focusing an image on pixel array 1301 when a shutter release button 1497 is pressed, central processing unit (CPU) 1495, such as a microprocessor which controls camera and one or more image flow functions, which communicates with one or more input/output (I/O) devices 1491 over a bus 1493. Imaging device 12 also communicates with CPU 1495 over bus 493. System 1400 also includes random access memory (RAM) 1492 and can optionally include removable memory 1494, such as flash memory, which also communicates with CPU 1495 over the bus 1493. Imaging device 12 may be combined with the CPU, with or without memory storage on a single integrated circuit or on a different chip. Although bus 1493 is illustrated as a single bus, it may be one or more busses, bridges or other communication paths used to interconnect system components of system 1400.

Various embodiments have been described illustrating imagers with separate pixel array and charge detection (e.g., readout) circuitry. An imager may include an array of pixels in which accumulated charge from each pixel is transferred from a photodiode to an output line by a corresponding transfer gate transistor. Multiple pixels may share an output line. For example, the pixel array may be arranged in rows and columns and all or some of the pixels of a column may be coupled to a shared output line. The pixel array may not include any reset or address transistors coupled to floating diffusion regions, or amplifier circuitry such as source follower transistors, because the charge detection circuitry is external to the pixel array. If desired, each pixel of the imager may include a charge storage diode that is shielded from incoming light and is used to store signals from the photodiodes for global shutter mode. Anti-blooming transistors may be coupled to the photodiodes and used to drain overflow charge from the photodiodes.

The external amplifier circuitry may include relatively complex amplifier circuitry such as operational amplifiers. Each signal bus from the pixel array may be coupled to an input of a corresponding operational amplifier. A feedback capacitor may be coupled between an output of the operational amplifier and an Input of the operational amplifier (e.g., a negative input). The feedback capacitor may be a voltage-controlled capacitor that controls gain of the operational amplifier. If desired, multiple feedback capacitors may be switchably connected between the amplifier output and input via a plurality of switches that selectively connect and selectively disconnect the feedback capacitors to control the gain of the operational amplifier. A frequency bandwidth-limiting capacitor may be coupled to the amplifier output to help reduce noise.

The foregoing is merely illustrative of the principles of this invention and various modifications can be made by those skilled in the art without departing from the scope and spirit of the invention.

What is claimed is:

1. An image sensor, comprising:
    an array of pixels that do not include any source follower transistors, wherein at least a portion of the array of pixels is coupled to a signal bus; and
    charge detection circuitry that is external to the array of pixels and coupled to the signal bus, wherein the charge detection circuitry comprises:
        pre-charge circuitry that includes a switch and a capacitor coupled to the signal bus, wherein the switch is operable in a first state in which the capacitor has a first capacitance value and a second state in which the capacitor has a second capacitance value, wherein the pre-charge circuitry increases a voltage swing at an output of the charge detection circuitry by changing the switch from the first state to the second state to provide the second capacitance to the signal bus.

2. The image sensor defined in claim 1 wherein the pixels do not include any reset transistors.

3. The image sensor defined in claim 2 wherein the pixels do not include any address transistors.

4. The image sensor defined in claim 1 wherein the image sensor comprises a first substrate having the array of pixels and a second substrate having the charge detection circuitry and wherein the first and second substrates are stacked on top of each other.

5. The image sensor defined in claim 1 wherein each of the pixels of the portion of the array that are coupled to the signal bus comprises:
    a photodiode that converts received light into a pixel signal;
    a charge storage diode that is shielded from the light;
    a first transfer gate coupled between the photodiode and the charge storage diode; and
    a second transfer gate coupled between the charge storage diode and the signal bus, wherein the image sensor operates in a global shutter mode by storing the pixel signal from the photodiode in the charge storage diode.

6. The image sensor defined in claim 5 wherein each of the pixels of the portion of the array that are coupled to the signal bus further comprises:
    an anti-blooming transistor coupled to the photodiode, wherein the anti-blooming transistor is operable to drain overflow charge from the photodiode.

7. The image sensor defined in claim 1 wherein the charge detecting circuitry comprises;
    an operational amplifier having an amplifier input coupled to the signal bus and an amplifier output; and
    a negative feedback path that is coupled between the amplifier output and the amplifier input, wherein the feedback path includes a negative feedback capacitor.

8. The image sensor defined in claim 7 wherein the negative feedback capacitor comprises a voltage controlled capacitor that controls gain of the operational amplifier.

9. The image sensor defined in claim 7 wherein the negative feedback capacitor comprises one of a plurality of negative feedback capacitors that are coupled between the amplifier output and the amplifier input, the charge detecting circuitry further comprising:
    a plurality of switches that control gain of the operational amplifier by selectively connecting and selectively disconnecting the negative feedback capacitors of the plurality of negative feedback capacitors between the amplifier output and the amplifier input.

10. The image sensor defined in claim 7 wherein the charge detecting circuitry further comprises:
    a frequency bandwidth-limiting capacitor coupled to the amplifier output.

11. The image sensor defined in claim 1 further comprising:
    a substrate having the array of pixels, wherein each pixel in the array comprises:
        a pinned photodiode region in the substrate; and
        a doped isolation layer under the pinned photodiode region; and
        a compensating implant in the doped isolation layer that passes charge generated in the substrate under the doped isolation layer to the pinned photodiode region.

12. The image sensor defined in claim 1 further comprising:
    a substrate having the array of pixels, wherein each pixel in the portion of the array that is coupled to the signal bus comprises:
        a photodiode region in the substrate;
        a transfer gate transistor in the substrate that couples the photodiode region to a floating diffusion region; and
        a charge drift region interposed in the substrate between the transfer gate transistor and the floating diffusion region to separate the transfer gate transistor and the floating diffusion region.

13. The image sensor defined in claim 12 wherein the array of pixels is organized in rows and columns of pixels and wherein the signal bus comprises one of a plurality of signal busses that are each coupled to a respective column of pixels, the image sensor further comprising:
compensation circuitry that is external to the array of pixels and is coupled between adjacent columns of pixels, wherein the compensation circuitry compensates for parasitic coupling between the adjacent column bus lines of pixels.

14. The image sensor defined in claim 1 wherein the charge detection circuitry performs correlated double sampling using the array of pixels to produce image signals, the image sensor further comprising:
analog-to-digital converter circuitry that is coupled to the charge detection circuitry and converts the analog image signals to digital image signals.

15. An image sensor operable in global shutter mode, comprising:
an array of pixels comprising:
a plurality of photodiodes;
a plurality of storage diodes;
a plurality of output lines; and
a plurality of first and second transfer gates, wherein each of the first transfer gates passes charge from a respective one of the photodiodes to a respective one of the storage diodes and wherein each of the second transfer gates passes charge directly from a respective one of the storage diodes to a respective one of the output lines; and
amplifier circuitry external to the pixel array that is coupled to the output lines.

16. The image sensor defined in claim 15 wherein the array of pixels is arranged in rows and columns of pixels, wherein the plurality of photodiodes are the pixels of a given one of the columns.

17. The image sensor defined in claim 16 wherein the image sensor comprises first and second stacked substrates that are coupled by chip-to-chip connections, wherein the array of pixels is formed on the first substrate, and wherein the amplifier circuitry is formed on the second substrate.

18. The image sensor defined in claim 17 wherein the amplifier circuitry comprises:
an operational amplifier having an amplifier input coupled to the output line and an amplifier output; and
a feedback capacitor coupled between the amplifier output and the amplifier input.

19. A system, comprising:
a central processing unit;
memory;
input-output circuitry; and
an imaging device, wherein the imaging device comprises:
a pixel array having rows and columns of pixels, wherein each column of pixels is coupled to a respective signal bus;
charge detection circuitry that is external to the pixel array and receives pixel signals from the pixel array over the signal busses;
pre-charge circuitry coupled to the signal busses that increases a voltage swing at an output of the charge detection circuitry; and
a lens that focuses an image on the pixel array, wherein each pixel of the array comprises:
a photodiode; and
a transfer gate that passes charge directly from the photodiode to the corresponding signal bus of that pixel.

20. The system defined in claim 19 wherein the imaging device comprises:
a first substrate in which the pixel array is formed;
a second substrate in which the charge detection circuitry is formed;
a color filter layer on the pixel array; and
a plurality of microlenses over the color filter layer.

* * * * *